United States Patent
Marbler (10) Patent No.: US 7,800,381 B2
(45) Date of Patent: Sep. 21, 2010

(54) TEST STRUCTURES, SYSTEMS, AND METHODS FOR SEMICONDUCTOR DEVICES

(75) Inventor: Wolfgang Marbler, Treffen (AT)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/861,461

(22) Filed: Sep. 26, 2007

(65) Prior Publication Data

US 2009/0079449 A1    Mar. 26, 2009

(51) Int. Cl.
*G01R 31/02*    (2006.01)

(52) U.S. Cl. .................................................... 324/754
(58) Field of Classification Search .................. 324/765, 324/158.1, 763, 754, 761–762; 257/48; 438/14–18
See application file for complete search history.

(56) References Cited

U.S. PATENT DOCUMENTS

| 5,537,038 | A  | * | 7/1996 | Ando .......................... 324/253 |
| 6,590,389 | B1 | * | 7/2003 | Shibasaki et al. ............ 324/252 |
| 7,345,563 | B2 | * | 3/2008 | Pavier ......................... 336/200 |

OTHER PUBLICATIONS

"Magnetic Field: B and H," Wikipedia, the free encyclopedia, http://en.wikipedia.org/wiki/Magnetic_field#B_and_H, downloaded Sep. 25, 2007, 1 p., Wikimedia Foundation Inc., St. Petersburg, FL.
"Transformer," Wikipedia, the free encyclopedia, http://en.wikipedia.org/wiki/Transformer, downloaded Sep. 25, 2007, 10 pp., Wikimedia Foundation Inc., St. Petersburg, FL.

* cited by examiner

*Primary Examiner*—Ha Tran T Nguyen
*Assistant Examiner*—Tung X Nguyen
(74) *Attorney, Agent, or Firm*—Slater & Matsil, L.L.P.

(57) ABSTRACT

Test structures, systems, and methods for semiconductor devices are disclosed. In one embodiment, a test structure for a semiconductor device includes a winding disposed in at least one conductive material layer of the semiconductor device. At least a portion of the winding extends proximate a perimeter of the semiconductor device. The winding includes a first end and a second end. A first test pad is coupled to the first end of the winding, and a second test pad is coupled to the second end of the winding.

4 Claims, 4 Drawing Sheets

TEST STRUCTURES, SYSTEMS, AND METHODS FOR SEMICONDUCTOR DEVICES

TECHNICAL FIELD

The present invention relates generally to the fabrication of semiconductor devices, and more particularly to test structures and testing of semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Semiconductor devices are tested using a variety of test processes at many stages of the manufacturing process. Some parameters that are tested include film thickness, film characterization, lithography accuracy measurements, and electrical performance parameters, as examples.

Magnetic fields may alter the performance of some semiconductor devices. A magnetic field may be generated in adjacent devices or integrated circuits that may impact semiconductor device performance, for example. In some applications, particularly in applications such as semiconductors comprising magnetic sensor devices, there is a need for testing and determining magnetic parameters of semiconductor devices.

Thus, what are needed in the art are test structures, systems, and methods for testing and determining magnetic parameters of semiconductor devices.

SUMMARY OF THE INVENTION

Technical advantages are generally achieved by embodiments of the present invention, which provide novel test structures, systems, and methods for semiconductor devices.

In accordance with one embodiment of the present invention, a test structure for a semiconductor device includes a winding disposed in at least one conductive material layer of the semiconductor device. At least a portion of the winding extends proximate a perimeter of the semiconductor device. The winding includes a first end and a second end. A first test pad is coupled to the first end of the winding, and a second test pad is coupled to the second end of the winding.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in automotive, industrial, and power semiconductor device applications and test systems and methods. Embodiments of the invention may also be implemented in other semiconductor applications that would benefit from testing magnetic effects and parameters, for example.

Embodiments of the present invention comprise novel test structures, systems, and methods. Embodiments of the present invention also comprise semiconductor devices comprising test structures and methods of fabrication thereof.

Figure 1:
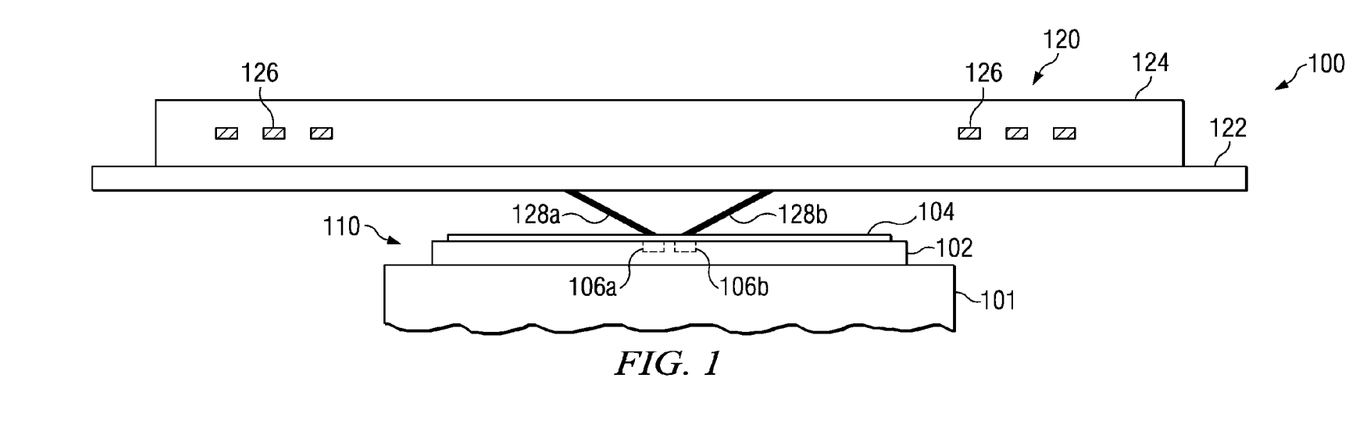
FIG. 1 shows a cross-sectional view of a test system for a semiconductor device in accordance with an embodiment of the present invention, wherein a probe card including a magnetic field generator is placed proximate a semiconductor device during testing.

Referring first to FIG. 1, a cross-sectional view of a test system 100 for a semiconductor device 110 in accordance with an embodiment of the present invention is shown, wherein a probe card 122 including a magnetic field generator 124 is placed proximate a semiconductor device 110 during testing. The test system 100 includes a support 101 for a semiconductor device 110. The magnetic field generator 124 is disposed proximate the semiconductor device support 101, and may be mounted on the probe card 122, as shown.

Figure 2:
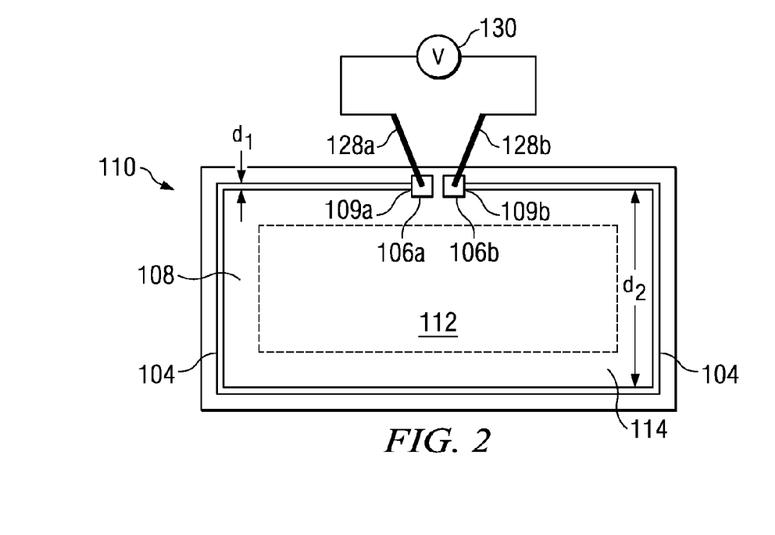
FIG. 2 shows a top view of a semiconductor device having a novel test structure formed thereon in accordance with an embodiment of the present invention.

The test system 100 includes an instrument adapted to measure an effect of a magnetic field produced by the magnetic field generator 124 on a semiconductor device 110 placed on the support 101. The instrument for measuring the effect of the magnetic field may comprise a voltmeter 130, as an example, as shown in FIG. 2, which also shows a top view of a semiconductor device 110 having a novel test structure formed thereon in accordance with an embodiment of the present invention. The semiconductor device 110 includes a workpiece 102 and a winding 104 that extends at least proximate a perimeter of the semiconductor device 110. At least a portion of the winding 104 extends along the perimeter of the semiconductor device 100 in some embodiments of the present invention. For example, the winding 104 shown in FIG. 2 extends along the entire perimeter of the die of the semiconductor device 100. Advantageously, the effect of the magnetic field from the magnetic field generator 124 is measurable across the winding 104 of the semiconductor device 110.

Figure 6:
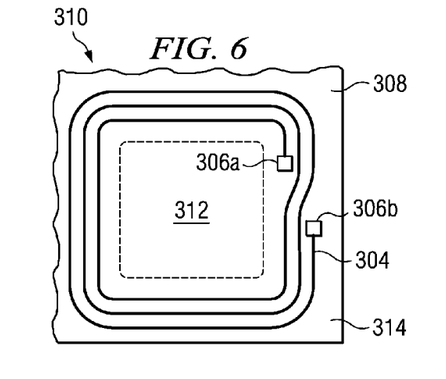
FIG. 6 shows a top view of a test structure of a semiconductor device in accordance with yet another embodiment of the present invention.
Figure 8:
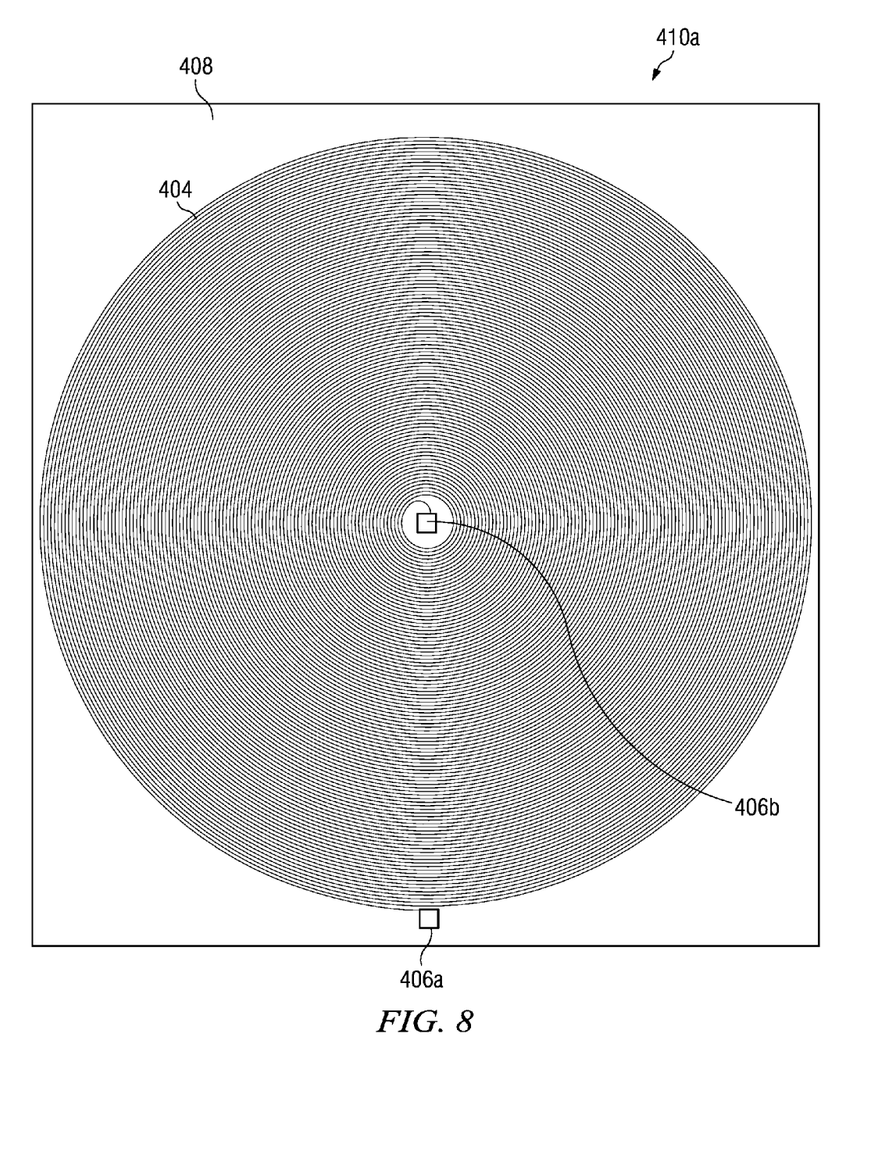
FIG. 8 shows a top view of a test structure of a semiconductor device comprising a dedicated test die in accordance with an embodiment of the present invention.

The winding 104 of the test structure of the semiconductor device 100 has a first end 109a and a second end 109b opposite the first end 109a, e.g., the second end 109b is disposed on an opposite end of the winding 104 from the first end 109a. The winding 104 is continuous in some embodiments. The winding 104 may be formed in one or more layers of the semiconductor device 110. The winding 104 may comprise one or more loops; for example, a winding 104 comprising a single loop is shown in the embodiment of FIG. 2. The winding 104 may alternatively comprise a plurality of loops, as shown in FIGS. 6 and 8, to be described further herein. The winding 104 is preferably symmetric, although alternatively, the winding 104 may be asymmetric.

The loop (or loops) of the winding 104 may be square or rectangular, in accordance with some embodiments of the present invention, e.g., comprising substantially the same shape as the die or chip of the semiconductor device 110. In other embodiments, however, the loop (or loops) of the winding 104 may alternatively be circular, oval, trapezoidal, octagonal, or other shapes, as examples, not shown.

The winding 104 of the semiconductor device 110 comprises a width having a dimension $d_1$, wherein $d_1$ comprises about 50 µm or less in some embodiments. Alternatively, dimension $d_1$ may comprise other dimensions. For example, dimension $d_1$ may be greater than 50 µm in some embodiments. The winding 104 may have a diameter or width from one side of the winding to another side of the winding comprising dimension $d_2$. Dimension $d_2$ may comprise about 10 to 50 µm less than the width of the die in some embodiments. For example, at least a portion of the winding may comprise a loop having a width (e.g., from one side of the loop to the other side of the loop) that is about 10 to 50 µm less than the width of the die. Alternatively, the dimension $d_2$ may comprise other dimensions.

In some embodiments, the winding 104 is formed in an unused region of the die, e.g., where no active areas or circuits or formed. In other embodiments, the winding 104 is formed in a ground region of the die. For example, the perimeter regions 114 of the die that the winding 104 is formed in may comprise unused regions and/or ground regions, e.g., wherein conductive ground wiring is formed, e.g., in conductive material layers above or below the conductive material layer the winding 104 is formed in.

In some embodiments, the winding 104 of the test structure of the semiconductor device 110 may be formed on a functional die. The central region of the winding 104 contains the active region 112 of the functional die in these embodiments, for example. Integrated circuits may be formed in the active region 112 of the semiconductor device 110, for example. The winding 104 is not formed over the active region 112 of the semiconductor device 110, in some embodiments. Alternatively, the winding 104 of the test structure of the semiconductor device 110 may be formed on a dedicated test die.

A first test pad 106a is coupled to the first end 109a of the winding 104, and a second test pad 106b is coupled to the second end 109b of the winding 104, as shown. The first and second test pads 106a and 106b may be contacted by probe needles 128a and 128b during the test process, for example. Alternatively, in some embodiments, the test structure of the semiconductor device 110 may include a multiplexer circuit (not shown), and test pads may be coupled to the multiplexer circuit on the semiconductor device. The probe needles 128a and 128b may be coupled to the test pads of the multiplexer circuit on the semiconductor device 110 to perform the tests. The novel tests of embodiments of the present invention may be implemented using a test mode of the semiconductor device 110, for example.

In some embodiments, the magnetic field generator 124 may include a conductive winding 126 that may comprise one or more loops, as shown in the cross-sectional view in FIG. 1. The magnetic field is producible by applying a current through the conductive winding 126 of the magnetic field generator 124, e.g., by induction. A current may be run or may be caused to flow through the conductive winding 126 of the magnetic field generator 124, for example. Alternatively, the magnetic field generator 124 may be adapted to generate a magnetic field using other means, for example. The magnetic field generator 124 is adapted to create a magnetic field using an alternating current (AC) frequency, in some embodiments.

Figure 3:
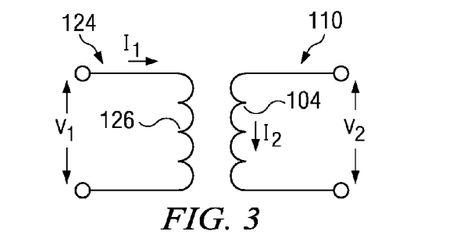
FIG. 3 illustrates a schematic representation of portions of the test system and test structure shown in FIGS. 1 and 2.

FIG. 3 illustrates a schematic representation of portions of the test system 100 and test structure of a semiconductor device 110 shown in FIGS. 1 and 2. For example, if a voltage $V_1$ is applied across the winding 126 of the magnetic field generator 124, a current $I_1$ is generated through the winding 126, which generates a magnetic field around the winding 126, due to electromagnetism. Voltage $V_1$ comprises an alternating voltage in some embodiments, such as about +/−5 volts or less, as an example, and current $I_1$ comprises an alternating current in some embodiments, such as about 5 mA or less, as an example, to achieve an alternating magnetic field. Alternatively, voltage $V_1$ and current $I_1$ may comprise other values. The alternating current generates a changing magnetic field within the winding 126.

In some embodiments, the magnetic field is generated by forcing a current $I_1$, wherein the strength of the magnetic field B generated is determinable, because the magnetic field B is proportional to N and $I_1$, according to Equation 1:

$$B \sim N^* I_1; \qquad \text{Eq. 1:}$$

wherein N is the number of loops of the conductive winding 126, for example. Alternatively, the voltage $V_1$ may be forced, and the current $I_1$ may be measured to obtain information about the strength of the generated magnetic field, as another example.

Because the magnetic field generator 124 is in close proximity to the winding 104 of the test structure on the semiconductor device 110, a current $I_2$ is generated by inductance in the winding 104 of the test structure. The current $I_2$ also creates a voltage $V_2$ across the winding 104, as shown in FIG. 3. The changing magnetic field surrounding the winding 126 and also winding 104 induces a voltage $V_2$ across the ends of winding 104, due to electromagnetic induction. Current $I_2$ comprises an alternating current in some embodiments, and voltage $V_2$ comprises an alternating voltage in some embodiments, for example. Thus, the effect of the magnetic field of the magnetic field generator 124 on the semiconductor device 110 may be determined by measurements made across the winding 104. At least one electromagnetic parameter of the semiconductor device 110 may determined by the measurements made on the winding 104 of the semiconductor device 110, for example.

The amount of the current $I_2$ and the voltage $V_2$ may vary based on the width or dimension $d_1$ of the winding 104, the number of loops of the winding 104, the width $d_2$ of the loops, the thickness of the winding 104 (e.g., the thickness of the conductive material layer the winding 104 is formed in), and/or the inductance of the winding 104, as examples. These parameters of the winding 104 of the semiconductor device 110 may be chosen and selected in order to achieve the desired amount of the current $I_2$ and the voltage $V_2$, for example. The amount of the current $I_2$ and the voltage $V_2$ may also vary based on the amount of current $I_1$ and the voltage $V_1$, for example.

The two windings 126 and 104 of the magnetic field generator 124 and the test structure of the semiconductor device 110, respectively, function similar to a transformer, wherein the winding 126 of the magnetic field generator 124 functions as a primary winding and the winding 104 of the semiconductor device 110 functions as a secondary winding, for example. The shared magnetic field generated in winding 126 induces a current in the winding 104 of the test structure on the semiconductor device 110.

A voltmeter 130 may be used to measure the voltage $V_2$ across the winding 104 of the test structure of the semiconductor device 110, as shown in FIG. 2. As another example, a current meter (not shown) may be used to measure the current $I_2$ in the winding 104. Alternatively, other measurements may be made, and other instruments may be used to measure the effects of the magnetic field on the winding 104 of the semiconductor device 110, for example.

The magnetic field generator 124 may be coupled to a probe card 122, for example, as shown. The probe card 122 includes at least two probe needles 128a and 128b in some embodiments. The effect of the magnetic field created by the magnetic field generator 124 may be measured by coupling a first probe needle 128a of the probe card 122 to the first test pad 106a and coupling a second probe needle 128b of the probe card 122 to the second test pad 106b. The probe card 122 may include a plurality of other probe needles, for example, not shown.

Advantageously, tests may be performed on circuitry and active areas formed in the active region 112 of the semiconductor device 110 while the magnetic parameter tests are performed using the test system 100. The effect of the magnetic field on the active region 112 during functional tests of the active region 112 may be measured and determined. Alternatively, the magnetic parameter tests using the test system 100 may be performed separately, at a different time than the functional tests for the active region 112 are performed. The probe card 122 or the support 101 may be coupled to a stepper to quickly move from die to die, or to move from groups of die to other groups of die, to rapidly perform the magnetic parameter tests, for example, e.g., in an in-line test process. The novel test system 100 and test structure of the semiconductor device 110 may advantageously be used for on-line monitoring of magnetic fields during wafer tests, for example.

Figure 4:
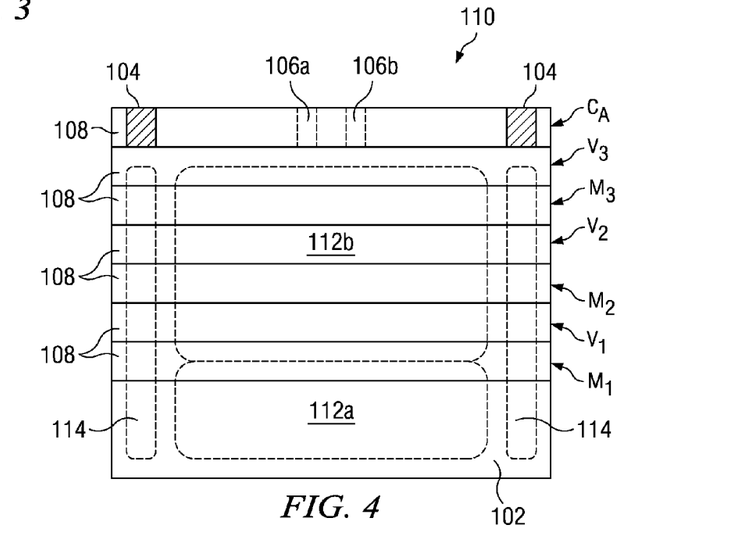
FIG. 4 shows a cross-sectional view of the test structure of the semiconductor device shown in FIG. 2.

FIG. 4 shows a cross-sectional view of the test structure of the semiconductor device 110 shown in FIG. 2. A cross-section of a single die of a wafer is shown in FIG. 4, for example. There may be dozens, hundreds, or more die formed on a single wafer, depending on the size of the die and the size of the wafer, for example.

To manufacture the semiconductor device 110, first, a workpiece 102 is provided. The workpiece 102 may include a semiconductor substrate comprising silicon or other semiconductor materials and may be covered by an insulating layer, for example. The workpiece 102 may also include other active components or circuits formed within and/or over the workpiece 102, not shown. The workpiece 102 may comprise silicon oxide over single-crystal silicon, for example. The workpiece 102 may include active areas formed in active region 112a comprising semiconductor elements, e.g., transistors, diodes, capacitors, etc., not shown. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples. The workpiece 102 may comprise peripheral regions 114 comprising ground regions or unused regions of a die, for example.

After the front end of the line (FEOL) processes are used to form the workpiece 102, one or more conductive material layers M1, V1, M2, V2, M3, V3, and CA are formed over the workpiece 102. For example, a plurality of metallization layers M1, M2, and M3 are shown in FIG. 4, with via layers V1, V2, and V3 being disposed between the metallization layers M1, M2, and M3. Conductive lines may be formed in the metallization layers M1, M2, and M3 between the insulating material layers 108, and vias may be formed in the via layers V1, V2, and V3 to provide connection between the metallization layers M1, M2, M3, and contact layer CA. The contact layer CA is disposed on an upper surface of the semiconductor device 110 in which contact pads may be formed; e.g., test pads 106a and 106b are shown in phantom in contact layer CA. The active regions 112b of the conductive material layers M1, V1, M2, V2, M3, V3, and CA are used to provide connection to the active areas in the active region 112a of the workpiece, to provide connection between some active areas to other active areas in the active region 112a, and to provide connections with contact pads formed in the contact layer CA, for example. There may be more conductive material layers or fewer conductive material layers in a semiconductor device 110 than are shown in FIG. 4.

The conductive material layers M1, V1, M2, V2, M3, V3, and CA may be formed using subtractive etch processes, wherein a conductive material is formed over the workpiece 102 and the conductive material is subtractively etched to pattern it, and then the insulating material layers 108 are deposited between the patterned conductive material. Alternatively, in accordance with some embodiments of the present invention, the conductive material layers M1, V1, M2, V2, M3, V3, and CA may be formed using damascene processes, wherein the insulating material layers 108 are deposited and patterned, and the conductive material is deposited to fill the patterns. Two adjacent conductive material layers such as layers M1 and V1, or V1 and M2, as examples, may be formed at once using a dual damascene process, for example.

For example, a plurality of insulating material layers 108 comprising a dielectric material is deposited over the workpiece 102. Each insulating material layer 108 may comprise about 1,000 to 4,000 Angstroms, or about 5,000 Angstroms or less, of an oxide such as $SiO_2$, a nitride such as $Si_3N_4$, a high-k dielectric material having a dielectric constant greater than about 3.9, a low-k dielectric material having a dielectric constant less than about 3.9, or combinations and multiple layers thereof, in some embodiments, as examples. Alternatively, the insulating material layers 108 may comprise other dimensions and materials, for example. The insulating material layers 108 may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

The insulating material layers 108 are patterned with conductive lines or vias, and in the embodiment shown in FIG. 4, the contact layer CA is patterned with the winding 104. A conductive material is formed over the insulating material layers 108 to fill the patterns in the insulating material layer 108. The conductive material is formed over the insulating material layers 108, and excess conductive material is removed from over the top surface of the insulating material layers 108 using an etch process and/or a chemical-mechanical polish (CMP) process, for example. In the contact layer CA, contact pads such as test pads 106a and 106b may be formed simultaneously with the formation of the winding 104, for example. Thus, additional etch processes and lithography processes may not be required to manufacture the novel winding 104 of the test structure in accordance with embodiments of the present invention. For example, the pattern for the winding 104 may be included in an existing mask level for the contact layer CA and/or other metallization layers M1, M2, or M3.

The conductive material used to form the winding 104 may comprise a metal in some embodiments, for example. The conductive material may comprise Al, Cu, alloys thereof, or combinations or multiple layers thereof, as examples. Alternatively, the conductive material used to form the winding 104 of the novel test structure may comprise other materials.

The winding 104 may be formed in a top conductive material layer such as layer CA as shown in FIG. 4, or alternatively, the winding 104 may be formed in other material layers M1, M2, or M3, for example (not shown). Vias may be formed in via layers V1, V2, or V3 to make electrical contact of the winding 104 to the test pads 106a and 106b. The winding 104 is formed in a back-end-of the line (BEOL) process in some embodiments, for example. The test pads 106a and 106b are coupled to the winding 104 elsewhere within the CA layer, for example, as shown in the top view of FIG. 2.

Figure 5:
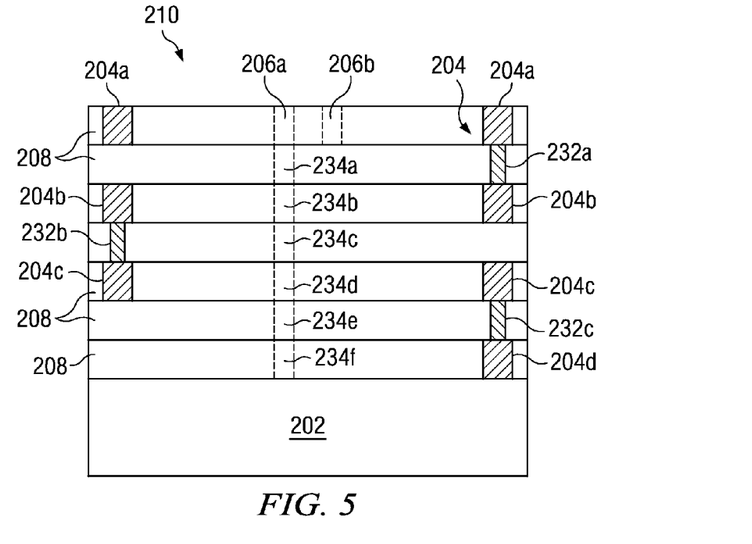
FIG. 5 shows a cross-sectional view of a test structure of a semiconductor device in accordance with another embodiment of the present invention.

FIG. 5 shows a cross-sectional view of a test structure of a semiconductor device 210 in accordance with another embodiment of the present invention. In this embodiment, the winding is formed in a plurality of material layers of the semiconductor device 210. Like numerals are used for the various elements that were described in FIGS. 1 through 4. To avoid repetition, each reference number shown in FIG. 5 is not described again in detail herein. Rather, similar materials x02, x04, x06, etc . . . may be used for the various material layers shown as were described for FIGS. 1 through 4, where x=1 in FIGS. 1 through 4 and x=2 in FIG. 5.

The winding 204 in this embodiment comprises several portions 204a, 204b, 204c, and 204d, each portion 204a, 204b, 204c, and 204d being formed in a different metallization layer and being coupled together by vias 232a, 232b, and 232c formed in via layers of the semiconductor device 210. The portions 204a, 204b, 204c, and 204d of the winding 204 each comprise at least a portion of a loop of the winding 204. For example, portion 204a of the winding 204 may comprise half of a loop and is coupled by via 232a to portion 204b which comprises another half of a loop. Portions 204c and 204d of the winding 204 may also comprise half loops, forming a spiral or coil through the conductive material layers of the semiconductor device 110, for example, that extends along and/or proximate the perimeter of the die. Alternatively, the portions 204a, 204b, 204c, and 204d of the winding 204 may comprise other shapes and may comprise more than one loop within each material layer, for example.

Only one via 232a, 232b, or 232c is shown coupling the portions 204a, 204b, 204c, or 204d together; however, in accordance with embodiments of the present invention, a plurality of vias may be used to couple the portions 204a, 204b, 204c, or 204d together. Vias 234a, 234b, 234c, 234d, 234e, and 234f, shown in phantom, may be formed in the metallization and via layers to couple the lower portion 204d of the winding 204 (e.g., the end of the winding) to one of the test pads 206a, also shown in phantom. Test pad 206b, shown in phantom, is coupled to the upper portion 204a of the winding 204 at the other end. The winding 204 may be formed in several conductive material layers, or in all of the conductive material layers of the semiconductor device 210, for example.

Thus, in the embodiment shown in FIG. 5, the winding 204 comprises a first portion 204a and at least one second portion 204b, wherein the first portion 204a of the winding is disposed in a first conductive material layer of the semiconductor device 210, wherein the at least one second portion 204b of the winding is disposed in at least one second conductive material layer of the semiconductor device, and wherein the at least one second portion is coupled to the first portion 204a by at least one via 232a disposed in at least one third conductive material layer of the semiconductor device 210.

FIG. 6 shows a top view of a test structure of a semiconductor device 310 in accordance with yet another embodiment of the present invention. Again, like numerals are used for the various elements that were used to describe the previous figures, and to avoid repetition, each reference number shown in FIG. 6 is not described again in detail herein. In this embodiment, the test structure comprises a winding 304 comprising a plurality of loops. The winding 304 is continuous and comprises three loops in the embodiment shown. Alternatively, the winding 304 may comprise other numbers of loops, for example. The semiconductor device 310 may include an active region 312 disposed in a central region thereof, wherein no portion of the winding 304 is formed, for example. The accuracy of the magnetic tests may be improved using a winding 304 having a larger number of loops, for example.

Figure 7:
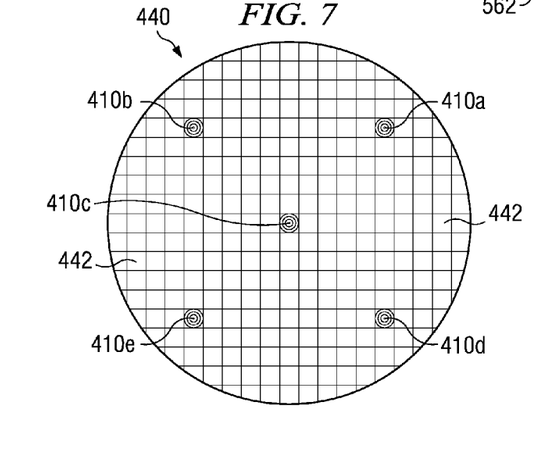
FIG. 7 shows a semiconductor wafer comprising a plurality of die, wherein some of the die comprise dedicated test die.

FIG. 7 shows a semiconductor wafer 440 comprising a plurality of die 442, wherein some of the die comprise dedicated test die 410a, 410b, 410c, 410d, and 410e. Again, like numerals are used for the various elements that were described in the previous figures, and to avoid repetition, each reference number shown in FIG. 7 is not described again in detail herein. The test die 410a, 410b, 410c, 410d, and 410e may be formed in predetermined locations of the wafer 440, as shown. The test die 410a, 410b, 410c, 410d, and 410e each comprise the novel windings described herein and may be used to perform magnetic (e.g., electromagnetic) parameter tests of the semiconductor device. Alternatively, the windings may be formed on each active die 442, for example.

FIG. 8 shows a top view of a test structure of a semiconductor device 410a comprising a dedicated test die in accordance with an embodiment of the present invention. The winding 404 may comprise hundreds of loops in this embodiment, and may extend fully to a central region of the die. For example, test pad 406b may be located on a central region of the die and may be coupled to one end of the winding 404. Test pad 406a may be located at the edge of the die and may be coupled to the other end of the winding 404. Alternatively, the winding 404 may comprise fewer loops and may be formed in a plurality of conductive material layers of the semiconductor device 410a.

Figure 9:
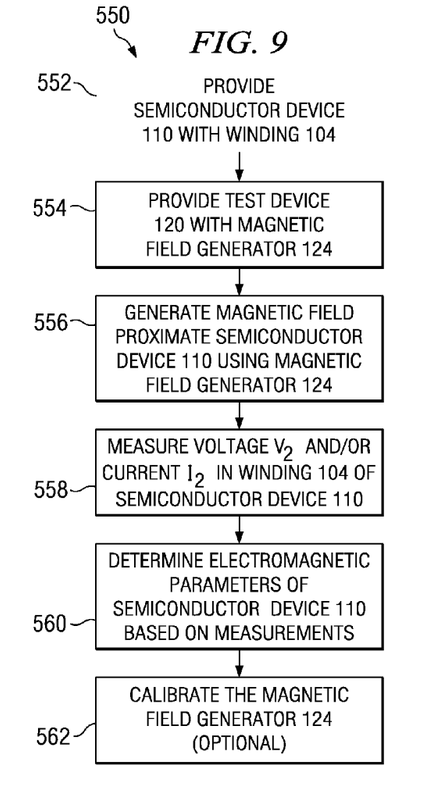
FIG. 9 is a flow chart illustrating a test method for a semiconductor device in accordance with embodiments of the present invention.

FIG. 9 is a flow chart 550 illustrating a test method for a semiconductor device in accordance with embodiments of the present invention. Referring to the flow chart 550 and also to FIG. 1, a semiconductor device 110 having a winding 104 formed thereon as described herein is first provided (step 552). A test device 120 with a magnetic field generator 124 is also provided (step 554). A magnetic field is generated proximate the semiconductor device 110 using the magnetic field generator 124 (step 556). The voltage $V_2$ and/or current $I_2$ (see FIG. 3) is measured in the winding 104 of the semiconductor device 110 (step 558). Magnetic parameters (e.g., electromagnetic parameters) of the semiconductor device 110 are determined based on the measurements taken (step 560).

In some embodiments, the magnetic field generator 124 may then be calibrated (optional step 562 in the flow chart 550). For example, using the known number of loops and geometric dimensions of the conductive winding 126 of the magnetic field generator 124, the magnetic flux density may be calculated based on the inductance, which determines a coil coefficient for the magnetic field generator 124 conductive winding 126, in milliTesla/Amperes (mT/A), which is a unit for magnetic flux density. Then, an amount of current $I_1$ may be determined, such as about 40 mT, as an example, that is required to be forced on the test structure comprising the winding 104 on the semiconductor device 110, e.g., to obtain threshold levels, sensitivity, or magnetic full scale ranges. Furthermore, after the magnetic field generator 124 is calibrated, the test structure comprising the winding 104 on a semiconductor device 110 may also be calibrated, for example.

The magnetic field generated by the magnetic field generator 124 may comprise a linked magnetic field, e.g., measurable in mT/A. The magnetic parameters measurable on the windings 104, 204, 304, and 404 determine the induced tension on the semiconductor device 110, 210, 310, and 410a from the magnetic field created by the magnetic field generator 124. An automatic control loop may be included to implement the magnetic parameter tests, for example. The vertical distance of the magnetic field generator 124 away from the semiconductor device 110, 210, 310, and 410a may be varied, and the pressure of the probe needles 128a and 128b may be varied during the tests, as examples.

In some embodiments, the semiconductor devices 110, 210, 310, and 410a may be tested at a predetermined magnetic flux density, which may be a function of the coil coefficient of the windings 104, 204, 304, and 404, for example. The semiconductor devices 110, 210, 310, and 410a may need to be tested at a predetermined magnetic flux density for the particular semiconductor windings 110, 210, 310, and 410a under test, in order to test parameters such as magnetic switching points, magnetic full scale range, and sensitivity, as examples. In some applications, e.g., for particular magnetic sensors, the semiconductor devices 110, 210, 310, and 410a may also be calibrated.

Embodiments of the present invention include semiconductor devices 110, 210, 310, and 410a and test structures including the novel windings 104, 204, 304, and 404 that have portions that extend along and/or proximate a perimeter of the die or semiconductor devices 110, 210, 310, and 410a. Embodiments of the present invention also include methods of fabricating the semiconductor devices 110, 210, 310, and 410a and test structures described herein, for example.

Advantages of embodiments of the present invention include providing improved methods of utilizing space in semiconductor devices 110, 210, 310, and 410a by fabricating the windings 104, 204, 304, and 404 of the test structures in electrically unused areas of metallization layers, or in ground regions of the semiconductor devices 110, 210, 310, and 410a. In some embodiments, the windings 104, 204, 304, and 404 may have substantially the same or similar dimensions as other interconnect features or devices such as conductive lines, so that the windings 104, 204, 304, and 404 of the test structures are easily integratable into existing semiconductor device structures and manufacturing process flows. The properties of the windings 104, 204, 304, and 404 of the test structures, e.g., the inductive properties, may be tuned by adjusting the number and size of the loops, the number of material layers the windings 104, 204, 304, and 404 are formed in, and the dimensions of the windings 104, 204, 304, and 404, for example.

Accuracy of the magnetic parameter tests may be improved by using a large number of loops in the windings 104, 204, 304, and 404. The windings 104, 204, 304, and 404 may include a single loop, a few loops, or hundreds or a thousand or more loops, e.g., when implemented in dedicated test die.

The test structures comprising windings 104, 204, 304, and 404 for measuring magnetic effects may be used to test devices used for automotive, industrial, and power semiconductor device applications, as examples. The magnetic effect tests are useful on devices such as magnetic sensors, other types of sensors, linear devices, and switches, for example. The test structures and magnetic effect tests may also be used on other types of semiconductor devices.

Tests performed using the test structures described herein provide information about the effects of magnetic fields that may be applied proximate the semiconductor devices 110, 210, 310, and 410a. The information may be used as a reference when characterizing parameters of the semiconductor devices 110, 210, 310, and 410a, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test structure for a semiconductor device, comprising:
a winding disposed in at least one conductive material layer of the semiconductor device, at least a portion of the winding extending proximate a perimeter of the semiconductor device, wherein the winding comprises a first portion and at least one second portion, wherein the first portion of the winding is disposed in a first conductive material layer of the semiconductor device, wherein the at least one second portion of the winding is disposed in at least one second conductive material layer of the semiconductor device, and wherein the at least one second portion is coupled to the first portion by at least one via disposed in at least one third conductive material layer of the semiconductor device, the winding comprising a first end and a second end;

a first test pad coupled to the first end of the winding; and a second test pad coupled to the second end of the winding.

2. The test structure according to claim 1, wherein an effect of a magnetic field proximate the winding is measurable at the first test pad and the second test pad.

3. The test structure according to claim 1, wherein the winding comprises a plurality of loops.

4. The test structure according to claim 1, wherein at least a portion of the winding extends along the perimeter of the semiconductor device.

* * * * *